United States Patent [19]

Ohtsuka et al.

[11] Patent Number: 4,895,176

[45] Date of Patent: Jan. 23, 1990

[54] CHLORO-FLUORO-CARBON CLEANING APPARATUS

[76] Inventors: Shigeo Ohtsuka; Toshio Horimoto; Shigeo Miyakoshi, all of 3-32, Kigawa-higashi, 3-chome, Yodogawa-ku, Osaka, Japan

[21] Appl. No.: 294,644

[22] Filed: Nov. 6, 1989

[51] Int. Cl.⁴ .............................................. B08B 3/10
[52] U.S. Cl. ........................................ 134/107; 34/77; 134/60; 134/109; 134/184; 202/170; 202/200
[58] Field of Search ............. 134/1, 60, 107, 108, 134/109, 184; 68/18 C; 202/170, 200, 201; 34/77

[56] References Cited

U.S. PATENT DOCUMENTS

| | | | |
|---|---|---|---|
| 2,977,962 | 4/1961 | Zucker | 134/111 |
| 3,085,948 | 4/1963 | Kearney | 134/108 X |
| 3,229,702 | 1/1966 | Murdoch, Jr. | 134/1 X |
| 3,308,839 | 3/1967 | Barday | 134/109 X |
| 4,029,517 | 6/1977 | Rand | 134/109 X |
| 4,055,196 | 10/1977 | Kearney | 134/109 X |

Primary Examiner—Philip R. Coe
Attorney, Agent, or Firm—Moonray Kojima

[57] ABSTRACT

This invention relates to a cleaning apparatus for cleaning workpieces such as semiconductors and other electronic devices by using chloro-fluoro-carbon solvent such as R113. Chloro-fluoro-carbon vapor is drawn from a lateral position of a layer of chloro-fluoro-carbon vapor through a suction duct and is cooled and liquefied in a collecting tank. The resulting liquid is returned to a cleaning tank through a return duct. This feature allows the gas generated from the chloro-fluoro-carbon vapor to be collected for repeated use, reduces the amount of chloro-fluoro-carbon solvent consumption, and prevents air pollution by the chloro-flouro-carbon gas. Further, the entire apparatus may readily be constructed as a unit, thus at low manufacturing cost.

3 Claims, 1 Drawing Sheet

CHLORO-FLUORO-CARBON CLEANING APPARATUS

SUMMARY OF THE INVENTION

This invention relates to a cleaning apparatus for cleaning workpieces such as semiconductors and other electronic devices by using chloro-fluoro-carbon solvent such as R113. Chloro-fluoro-carbon vapor is drawn from a lateral position of a layer of chloro-fluoro-carbon vapor through a suction duct and is cooled and liquefied in a collecting tank. The resulting liquid is returned to a cleaning tank through a return duct. This feature allows the gas generated from the chloro-fluoro-carbon vapor to be collected for repeated use, reduces chloro-fluoro-carbon solvent consumption, and prevents air pollution by the chloro-fluoro-carbon gas. Further, the entire apparatus may readily be constructed as a unit, thus at low manufacturing cost.

BACKGROUND OF THE INVENTION

Conventionally, chloro-fluoro-carbon solvent such as R113 is used for cleaning workpieces such as semi-conductors and other electronic devices, since chloro-fluoro-carbon solvent is least noxious and chemically stable, and has no possibility of damaging articles to be cleaned.

However, since chloro-fluoro-carbon R113 has a low boiling point of 47.6° C. and its vapor, therefore, sometimes flows out into the ambient during a cleaning operation.

To prevent the outflow of chloro-fluoro-carbon vapor and to collect gas generated from the chloro-fluoro-carbon vapor, a large chloro-fluoro-carbon collecting apparatus has heretofore been employed such as an active carbon adsorption apparatus comprising an adsorption rotor having active carbon shaped into a honeycomb form. This apparatus, however, has various disadvantages. For example, the apparatus is troublesome to control, expensive, and difficult to combine with a chloro-fluoro-carbon cleaning apparatus into a unit.

OBJECTS OF THE INVENTION

A primary object of this invention is to provide a chloro-fluoro-carbon cleaning apparatus, in which chloro-fluoro-carbon vapor is drawn from a lateral position of a layer of chloro-fluoro-carbon vapor through a suction duct to a collecting tank, and gas contained in the chloro-fluoro-carbon is cooled and liquefied by an evaporator mounted in the collecting tank, thereby allowing gas generated from the chloro-fluoro-carbon vapor to be collected for repeated use, reducing chloro-fluoro-carbon solvent consumption, preventing air pollution by the chloro-fluoro-carbon gas, reducing the amount of chloro-fluoro-carbon carried out by the workpieces, and facilitating integration of the entire apparatus into a unit to lower manufacturing cost of the apparatus.

Another object of this invention is to provide a chloro-fluoro-carbon apparatus, in which high concentration chloro-fluoro-carbon gas is drawn from a region above and adjacent a cooling jacket disposed in an upper position of a cleaning tank, and is introduced through an air pump to a porous filter mounted in a collecting tank, thereby forcibly drawing chloro-fluoro-carbon gas from a high concentration region, causing the gas to pass through the porous filter to form fine gas bubbles, to increase areas of contact between the fine gas bubbles and the chloro-fluoro-carbon liquid and to achieve great improvement in the chloro-fluoro-carbon gas collecting efficiency and the liquefying efficiency of collected chloro-fluoro-carbon gas.

A further object of the invention is to provide a chloro-fluoro-carbon cleaning apparatus including an upper duct disposed over an entire top opening area of a cleaning tank and communicating at one end thereof with a collecting tank, for collecting and liquefying low concentration chloro-fluoro-carbon gas for repeated use.

A still further object of the invention is to provide a chloro-fluoro-carbon cleaning apparatus including a deaerating tank disposed between a water separating tank and a ultrasonic cleaning tank, the deaerating tank including heating means for heating and bubbling up chloro-fluoro-carbon solvent, thereby to strip the chloro-fluoro-carbon solvent of air having mixed thereinto for promoting the ultrasonic action and cleaning capability.

Other objects of this invention will be apparent from the following description of a preferred embodiment.

BRIEF DESCRIPTION OF THE DRAWING

The drawing shows an embodiment of this invention, in which:

DESCRIPTION OF THE PREFERRED EMBODIMENT

Figure 1:
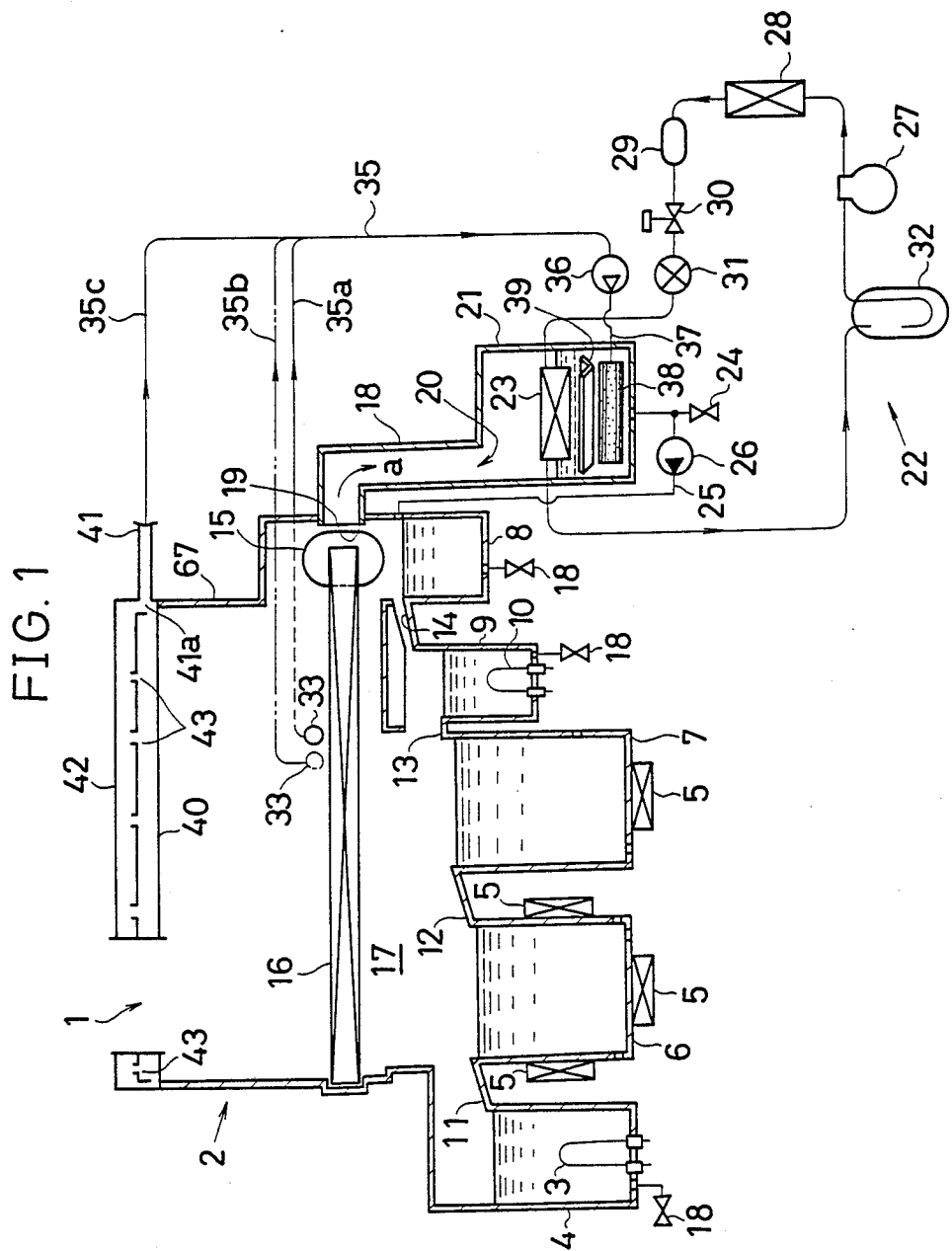
FIG. 1 is a system diagram of a chloro-fluoro-carbon cleaning apparatus.

An embodiment of this invention will be described in detail hereinafter with reference to the drawing.

Referring to FIG. 1, a chloro-fluoro-carbon cleaning apparatus comprises a cleaning chamber 2 having a workpiece passage 1.

The cleaning chamber 2 includes a distillation tank 4 with a heater 3 installed therein, a first and a second ultrasonic tanks 6 and 7 having one to five ultrasonic oscillators 5 mounted outside, which oscillators 5 give ultrasonic oscillations with an oscillation frequency in the range of 27 to 200 KHz, and a water separating tank 8. A deaerating tank (or vaporizing tank) 9 is disposed between the second ultrasonic tank 7 and the water separating tank 8. The deaerating tank 9 has a heater 10 installed therein which acts as heating means to heat and bubble away air having mixed into chloro-fluoro carbon solvent. A drain valve 48 is connected to a bottom portion of tanks 4, 8, and 9.

These tanks 4, 6, 7, 9 and 8 are partitioned by downflow partition plates 11, 12, 13 and 14. Each of the tanks 4, 6, 7, 9 and 8 stores R113, namely 1,1,2-trichloro-1,2,2-trifluoro-ethane, acting as the chloro-fluoro-carbon solvent expressed in the chemical formula $CCl_2F \cdot CClF_2$.

A cooling coil 15 is disposed above the water separating tank 8 for condensing chloro-fluoro-carbon gas. Further, a cooling jacket 16 extends horizontally at an upper position in the cleaning chamber 2 substantially over an entire length thereof.

A refrigerator or a cold water generator known as a chiller which uses a cold medium may be employed as a cold source for the cooling jacket 16.

A layer of chloro-fluoro-carbon vapor 17 is formed between the cooling jacket 16 and R113 surfaces in the tanks 4, 6, 7, 9 and 8.

A suction duct 18 is connected to the cleaning chamber 2, with a top opening 19 of the duct 18 opposed to a lateral side of the layer of chloro-fluoro-carbon vapor 17, and specifically a lateral position of the cooling jacket 16. The suction duct 18 draws the chloro-fluoro-carbon vapor by means of a temperature difference.

The suction duct 18 communicates at a bottom opening 20 thereof with a collecting tank 21. The collecting tank 21 includes an evaporator 23 associated with a refrigerator 22 which will be described later.

A drain valve 24 is connected to a bottom position of the collecting tank 21, and a return duct 25 extends from the bottom of the collecting tank 21 to an upper position of the water separating tank 8 for returning chloro-fluoro-carbon cooled and liquefied by the evaporator 23 to the water separating tank 8. The return duct 25 includes a liquid pump 26 mounted at an intermediate position thereof for causing return flows of the liquefied chloro-fluoro-carbon.

The refrigerator 22 empolys a cold medium such as chloro-fluoro-carbon R11, R12 or R22 and provides a refrigerating loop through a compressor 27, a condenser 28, a liquid receiver 29, an electromagnetic valve 30, an expansion valve 31 acting as an expansion mechanism connected to the evaporator 23, and an accumulator 32 disposed between the evaporator 23 and the compressor 27.

In the above refrigerator 22, as is well known, the high-pressure cold medium after being compressed by the compressor 27 is delivered to the condenser 28 to be liquefied for delivery to the liquid receiver 29. Thereafter the high-pressure cold liquid medium is led through the electromagnetic valve 30 to the expansion valve 31 where the medium is throttled and expanded to be reduced in pressure. The resulting low-pressure cold medium enters the evaporator 23 where the cold medium absorbs ambient heat and evaporates into a gas. This gas is drawn through the accumulator 32 back into the compressor 27.

The refrigerator 22 is driven under control of a temperature sensor (not shown) disposed in the collecting tank 21. The evaporator 23, which has the function to take heat away from a substance to be cooled, cools the chloro-fluoro-carbon vapor in the collecting tank 21 to $-10°$ C. or less, preferably to $-20°$ to $-30°$ C., thereby liquefying the chloro-fluoro-carbon vapor.

There are suction ports 33 provided above and adjacent the cooling jacket 16 for drawing high concentration chloro-fluoro-carbon gas.

These suction ports 33 are disposed at a front position and a rear position in a housing 34 defining the cleaning chamber 2. The suction ports 33 are connecting through introductive suction ducts 35a and 35b and a confluence suction duct 35 to a suction port of an air pump 36.

The air pump 36 has a delivery port connected to a collecting duct 37. The collecting duct 37 communicates at a forward end thereof with a porous filter 38 formed of a sintered metal and immersed in the chloro-fluoro-carbon liquid in the collecting tank 21.

The collecting tank 21 houses a baffle plate 39 having a V-shaped section and disposed between the porous filter 38 and the evaporator 23.

The cleaning chamber 2 is in the form of a tank opening at the top. Its top opening 40 defines the workpiece passage 1 for allowing entry and exit of workpieces under cleaning treatment.

The cleaning chamber 2 has an upper duct 42 disposed over the top opening 40 except where the workpiece passage 1 is defined. A suction pipe 41 has a top suction port 41a opening into the upper duct region. The upper duct 42 defines suction ports 43 in a bottom surface thereof.

These suction ports 43 communicate with the suction pipe 41 through the upper duct 42, with the top suction port 41a also communicating with the suction pipe 41.

The suction pipe 41 is connected at the other end thereof to the confluence suction duct 35 through an introductive suction duct 35c.

How the illustrated embodiment operates will be described hereinafter.

When power is supplied to the heater 3 mounted in the distillation tank 4, R113 is heated and the layer of chloro-fluoro-carbon vapor 17 is formed between the liquid surfaces and the cooling jacket 16.

In this state, workpieces to be cleaned are introduced from the workpiece passage 1 through the layer of chloro-fluoro-carbon vapor 17 successively into the first and second ultrasonic tanks 6 and 7. Then ultrasonic cleaning is effected on the workpieces. During removal, the workpieces are subjected to the vapor cleaning and heating action of the layer of chloro-fluoro-carbon vapor 17, which has the effect of shortening a drying time.

When the workpieces are moved upward, gas generated from the chloro-fluoro-carbon vapor tends to flow upward and out into the ambient. However, this gas becomes condensed into a reduced volume due to a temperature difference between $+47.6°$ C. and $-30°$ C. or less, and is drawn through the top opening 19 of the suction duct 18 as indicated by an arrow a.

The chloro-fluoro-carbon vapor thus flows through the suction duct 18 down into the collecting tank 21, where the vapor is cooled and liquefied by the action of the evaporator 23.

In addition, the air pump 36 is driven to forcibly draw high concentration chloro-fluoro-carbon gas through the suction ports 33 above and adjacent the cooling jacket 16, and low concentration chloro-fluoro-carbon gas through the suction ports 43 of the upper duct 42. The high concentration chloro-fluoro-carbon gas and low concentration chloro-fluoro-carbon gas drawn in this way are delivered through the suction ducts 35a, 35b, 35c and 35, air pump 36 and collecting duct 37 to the porous filter 38 immersed in the liquid in the collecting tank 21.

By passing through the porous filter 38, the chloro-fluoro-carbon gas becomes fine gas bubbles which contact the chloro-fluoro-carbon liquid at $-20°$ to $-30°$ C. in the collecting tank 21. As a result, the chloro-fluoro-carbon gas all becomes condensed and liquefied.

The baffle plate 39 disposed between the porous filter 38 and the evaporator 38 promotes the efficiency of gas-liquid contact between the fine chloro-fluoro-carbon bubbles and the chloro-fluoro-carbon liquid.

Consequently, a great improvement has been made in the chloro-fluoro-carbon gas collecting efficiency and the liquefying efficiency of collected chloro-fluoro-carbon gas.

The cooled chloro-fluoro-carbon in the collecting tank 21 is returned by the liquid pump 26 through the return duct 25 to the upper position of the water separating tank 8 for repeated use.

Since the gas generated from the chloro-fluoro-carbon vapor is effectively collected for repeated use as described above, chloro-fluoro-carbon solvent R113 is consumed in a reduced amount, and chloro-fluoro-carbon gas is prevented from polluting atmospheric air. Furthermore, the construction according to this invention produces the effect of reducing the amount of chloro-fluoro-carbon carried out by the workpieces under cleaning treatment.

Fresh chloro-fluoro-carbon liquid at about 35°–40° C. stripped of water in the water separating tank 8 flows down the partition plate 14 into the deaerating tank 9. This chloro-fluoro-carbon solvent R113 contains air mixed thereinto.

The heater 10 mounted in the deaerating tank 9 to act as heating means is electrified to heat the chloro-fluoro-carbon solvent R113 to 47° C., for example. Then R113 is bubbled up and the air is released therefrom, whereby R113 becomes completely airless.

The deaerated, high concentration chloro-fluoro-carbon solvent is successively supplied to the second ultrasonic tank 7 and the first ultrasonic tank 6 via the downflow partition plates 13 and 12, respectively. Thus, there occurs no absorption by air of utrasonic wave, thereby improving ultrasonic wave imparting force of the ultrasonic oscillators 5 and ultrasonic cleaning capability of the chloro-fluoro-carbon solvent in the ultrasonic tanks 6 and 7, namely improving output.

According to a first aspect of this invention, the chloro-fluoro-carbon vapor is drawn from a lateral position of the layer of chloro-fluoro-carbon vapor 17 and is cooled and liquefied in the collecting tank 21 as described above. This feature allows the gas generated from the chloro-fluoro-carbon vapor to be collected for repeated use, reduces chloro-fluoro-carbon solvent consumption, prevents air pollution by the chloro-fluoro-carbon gas, and reduces the amount of chloro-fluoro-carbon carried out by the workpieces.

Further, the chloro-fluoro-carbon vapor is drawn into the suction duct 18 by virtue of a temperature difference, that is, a difference in specific gravity and a reduction in volume due to condensation and liquefication. This vapor drawing action, therefore, does not require any special drive means.

In addition, the entire apparatus may be constructed as an integral unit since the suction duct 18 and other simple devices and pipings may readily be attached to the cleaning chamber 2.

According to a second aspect of the invention, chloro-fluoro-carbon gas is drawn from a high concentration region through the suction ports 33, and is introduced through the suction duct 35 and air pump 36 to the porous filter 38 immersed in the liquid stored in the collecting tank 21. By passing through the porous filter 38, the chloro-fluoro-carbon gas becomes fine gas bubbles which contact the chloro-fluoro-carbon liquid in the collecting tank 21. This results in greatly increased areas of contact between the fine gas bubbles and the chloro-fluoro-carbon liquid.

Consequently, a great improvement has been made in the chloro-fluoro-carbon gas collecting efficiency and the liquefying efficiency of collected chloro-fluoro-carbon gas.

Further, according to this invention, the low concentration chloro-fluoro-carbon gas is collected from a top position of the cleaning chamber 2 to be cooled and liquefied for repeated use, in parallel with the collection and liquefication of the high concentration chloro-fluoro-carbon gas. This feature is not only effective for positive prevention of air pollution by the chloro-fluoro-carbon gas but realizes a greatly improved efficiency of chloro-fluoro-carbon solvent recycling.

Still further, the invention includes the feature of heating the chloro-fluoro-carbon solvent with the heating means (i.e. heater 10) mounted in the deaerating tank 9, to deaerate the solvent through bubbling. Thus the chloro-fluoro-carbon solvent supplied from the water separating tank 8 through the deaerating tank 9 to the ultrasonic cleaning tanks 6 and 7 has high liquid concentration. Since the deaerated, high concentration chloro-fluoro-carbon solvent is used for ultrasonic cleaning of the workpieces, there occurs no absorption by air of utrasonic wave, thereby improving ultrasonic action and cleaning capability.

The chloro-fluoro-carbon solvent may comprise chloro-fluoro-carbon R113 mixed with 4% by weight of ethanol or mixed with 50% by weight of ethylene chloride, depending on the intended use.

We claim:

1. A chloro-fluoro-carbon cleaning apparatus comprising a cleaning tank (2) for storing chloro-fluoro-carbon solvent;

means (16,4,6,7,8,9,) for forming a layer of chloro-fluoro-carbon vapor within said cleaning tank;

a suction duct (18) connected to said cleaning tank at a lateral position thereof where said layer of chloro-fluoro-carbon vapor is formed;

a collecting tank (21) connected to said suction duct (18) and including an evaporator (23) for cooling and liquifying gas generated from said chloro-fluoro-carbon vapor;

a return duct (25) extending from a bottom position of said collecting tank (25) to said cleaning tank (2) for returning chloro-fluoro-carbon solvent resulting from cooling and liquefying;

a cooling jacket (16) disposed in an upper position of said cleaning tank;

suction ports (33) arranged above and adjacent said cooling jacket for drawing high concentration chloro-fluoro-carbon gas;

a suction duct (35a,35b) connected to said suction ports; and an air pump (36) connected to said suction duct;

said collecting tank (2) further including a porous filter (38) immersed in the chloro-fluoro-carbon liquid in said collecting tank, and said air pump (36) having a delivery end communicating with said porous filter (38).

2. A chloro-fluoro-carbon cleaning apparatus comprising a cleaning tank (2) for storing chloro-fluoro-carbon solvent;

mans (16,4,6,7,8,9) for forming a layer of chloro-fluoro-carbon vapor within said cleaning tank;

a suction duct (18) connected to said cleaning tank at a lateral position thereof where said layer of chloro-fluoro-carbon vapor is formed;

a collecting tank (21) connected to said suction duct (18) and including an evaporator (23) for cooling and liquifying gas generated from said chloro-fluoro-carbon vapor; and a return duct (25) extending from a bottom position of said collecting tank (25) to said cleaning tank (2) for returning chloro-fluoro-carbon solvent resulting from cooling and liquifying;

wherein said cleaning tank (2) includes an upper duct (42) disposed over an entire top opening area thereof except where a workpiece passage (1) is defined, said upper duct (42) defining suction ports (43) for drawing the chloro-fluoro-carbon vapor, and communicating at one end thereof with said collecting tank (21).

3. A chloro-fluoro-carbon cleaning apparatus comprising a cleaning tank (2) for storing chloro-fluoro-carbon solvent;

means (16,5,6,7,8,9) for forming a layer of chloro-fluoro-carbon vapor within said cleaning tank;

a suction duct (18) connected to said cleaning tank at a lateral position thereof where said layer of chloro-fluoro-carbon vapor is formed;

a collecting tank (21) connected to said suction duct (18) and including an evaporator (23) for cooling and liquifying gas generated from said chloro-fluoro-carbon vapor; and a return duct (25) extending from a bottom position of said collecting tank (25) to said cleaning tank (2) for returning chloro-fluoro-carbon solvent resulting from cooling and liquifying;

wherein said means for forming comprises a water separating tank (8), an ultrasonic cleaning tank (6 or 7), and a deaerating tank (9) disposed toward the bottom of said cleaning tank (2), with said deaerating tank (9) being positioned between said water separating tank (8) and said ultrasonic cleaning tank (6, or 7), said deaerating tank (9) including heating means (10) for heating and bubbling up the chloro-fluoro-carbon solvent, thereby to strip the chloro-fluoro-carbon solvent of any air mixed therein.

* * * * *